(12) United States Patent
Ha et al.

(10) Patent No.: US 10,811,358 B2
(45) Date of Patent: Oct. 20, 2020

(54) HYBRID INTERPOSER AND SEMICONDUCTOR PACKAGE INCLUDING THE SAME

(71) Applicant: SAMSUNG ELECTRO-MECHANICS CO., LTD., Suwon-si, Gyeonggi-do (KR)

(72) Inventors: Job Ha, Suwon-si (KR); Sung Hyun Kim, Suwon-si (KR); Ji Na Jeung, Suwon-si (KR)

(73) Assignee: SAMSUNG ELECTRO-MECHANICS CO. LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/513,171

(22) Filed: Jul. 16, 2019

(65) Prior Publication Data

US 2020/0168552 A1 May 28, 2020

(30) Foreign Application Priority Data

Nov. 27, 2018 (KR) .................. 10-2018-0148327

(51) Int. Cl.
| | | |
|---|---|---|
| *H01L 23/538* | (2006.01) | |
| *H01L 23/00* | (2006.01) | |
| *H01L 23/14* | (2006.01) | |
| *H01L 23/15* | (2006.01) | |

(52) U.S. Cl.
CPC ........ *H01L 23/5385* (2013.01); *H01L 23/145* (2013.01); *H01L 23/147* (2013.01); *H01L 23/15* (2013.01); *H01L 23/5383* (2013.01); *H01L 23/5386* (2013.01); *H01L 23/5389* (2013.01); *H01L 24/16* (2013.01); *H01L 24/20* (2013.01);

(Continued)

(58) Field of Classification Search
CPC . H01L 23/5385; H01L 23/145; H01L 23/147; H01L 23/15; H01L 23/5383; H01L 23/5386; H01L 23/5389; H01L 24/16; H01L 24/20; H01L 2224/16227; H01L 2224/214
USPC ........................................................ 257/668
See application file for complete search history.

(56) References Cited

U.S. PATENT DOCUMENTS 9,048,233 B2 6/2015 Wu et al.
10,720,417 B2 * 7/2020 Scanlan .................. H01L 25/50
2012/0049366 A1 3/2012 Zeng

* cited by examiner

*Primary Examiner* — Tu-Tu V Ho
(74) *Attorney, Agent, or Firm* — Morgan, Lewis & Bockius LLP

(57) ABSTRACT

A semiconductor package includes an organic frame having first and second surfaces opposing each other, having a cavity, and having a wiring structure connecting the first and second surfaces, a connection structure disposed on the first surface of the organic frame and having a first redistribution layer connected to the wiring structure, at least one inorganic interposer having first and second surfaces, and having an interconnection wiring connecting the first and second surfaces of the at least one inorganic interposer to each other, an encapsulant encapsulating at least a portion of the at least one inorganic interposer, an insulating layer disposed on the second surface of the organic frame and the second surface of the at least one inorganic interposer, a second redistribution layer having portions provided as a plurality of pads, and at least one semiconductor chip having connection electrodes respectively connected to the plurality of pads.

20 Claims, 12 Drawing Sheets

(52) U.S. Cl.
CPC ............... *H01L 2224/16227* (2013.01); *H01L 2224/214* (2013.01)

I-I'

HYBRID INTERPOSER AND SEMICONDUCTOR PACKAGE INCLUDING THE SAME

CROSS-REFERENCE TO RELATED APPLICATION

This application claims benefit of priority to Korean Patent Application No. 10-2018-0148327 filed on Nov. 27, 2018 in the Korean Intellectual Property Office, the disclosure of which is incorporated herein by reference in its entirety.

TECHNICAL FIELD

The present disclosure relates to a hybrid interposer and a semiconductor package including the same.

BACKGROUND

The market for interposers has been growing, due to the high specification of sets and the employment of a high bandwidth memory (HBM). At present, silicon is a mainstream material of interposers, but glass or organic type interposers have been developed in terms of large-scale and low cost.

Meanwhile, in the case of a semiconductor package including an interposer, the semiconductor package is manufactured by performing a package process to adhere a semiconductor chip to the interposer and mold the semiconductor chip, and a connection structure having a redistribution layer to be used as the interposer may be previously manufactured before mounting the semiconductor chip.

SUMMARY

An aspect of the present disclosure may provide a hybrid substrate capable of realizing fine pitches and a semiconductor package having the same.

According to an aspect of the present disclosure, a semiconductor package may include: an organic frame having first and second surfaces opposing each other, having a cavity, and having a wiring structure connecting the first and second surfaces; a connection structure disposed on the first surface of the organic frame and having a first redistribution layer connected to the wiring structure; at least one inorganic interposer disposed in the cavity, having a first surface in contact with the connection structure and a second surface opposite to the first surface, and having an interconnection wiring connected to the first redistribution layer and connecting the first surface and the second surface of the at least one inorganic interposer to each other; an encapsulant encapsulating at least a portion of the at least one inorganic interposer disposed in the cavity; an insulating layer disposed on the second surface of the organic frame and the second surface of the at least one inorganic interposer; a second redistribution layer disposed on the insulating layer, connected to each of the wiring structure and the interconnection wiring, and having portions provided as a plurality of pads; and at least one semiconductor chip having connection electrodes respectively connected to the plurality of pads.

According to another aspect of the present disclosure, a hybrid interposer may include: an organic frame having first and second surfaces opposing each other, having a cavity, and having a wiring structure connecting the first and second surfaces; a connection structure disposed on the first surface of the organic frame and having a first redistribution layer connected to the wiring structure; at least one inorganic interposer disposed in the cavity, having a first surface in contact with the connection structure and a second surface opposite to the first surface, and having an interconnection wiring connected to the first redistribution layer and connecting the first surface and the second surface of the at least one inorganic interposer to each other; an encapsulant encapsulating at least a portion of the at least one inorganic interposer disposed in the cavity; an insulating layer disposed on the second surface of the organic frame and the second surface of the at least one inorganic interposer; and a second redistribution layer disposed on the insulating layer, connected to each of the wiring structure and the interconnection wiring, and having portions provided as a plurality of pads.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, exemplary embodiments in the present disclosure will be described in detail with reference to the accompanying drawings.

Electronic Device

Figure 1:
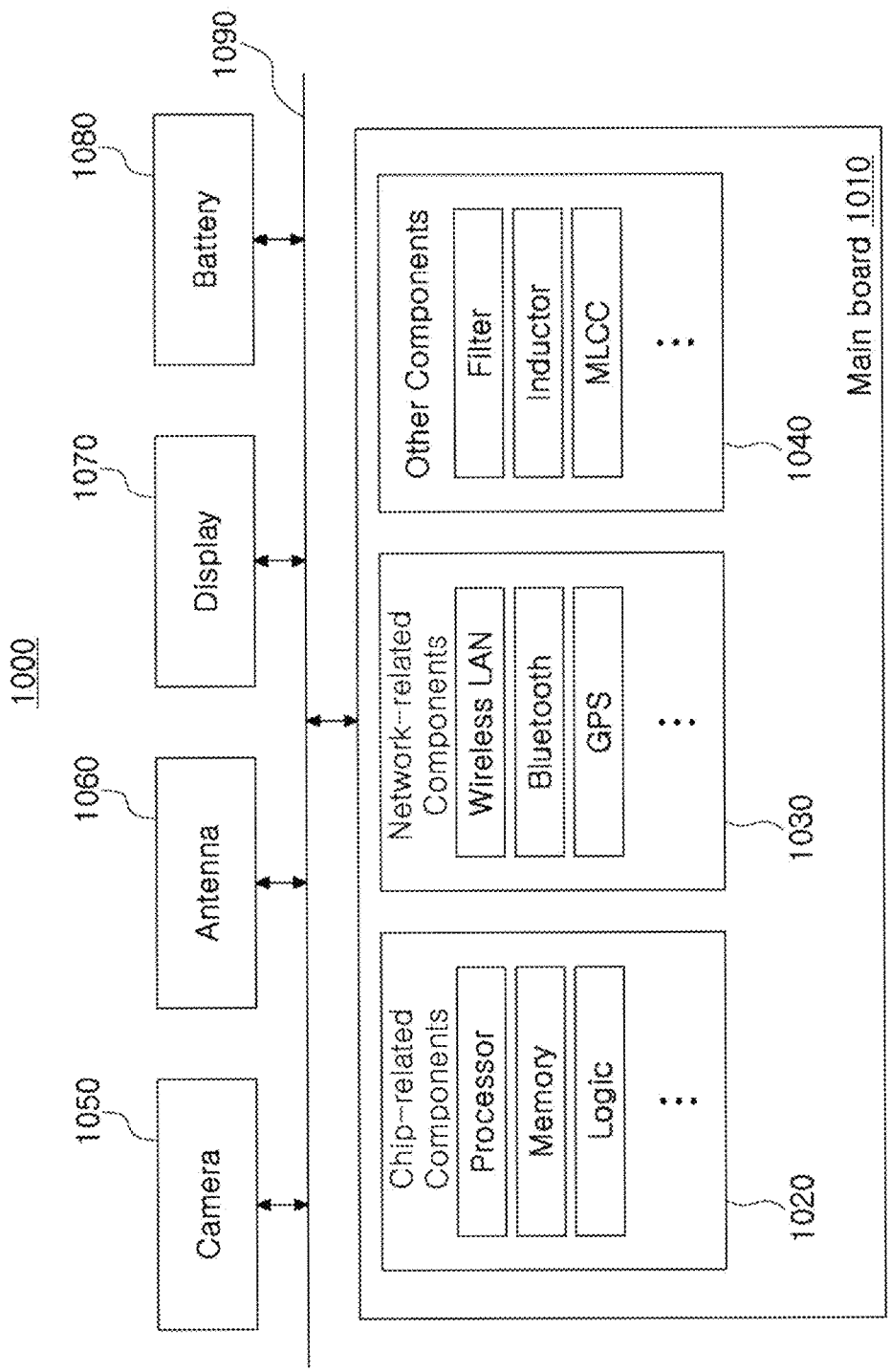
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to other components, to be described below, to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, and may also include other types of chip related components. In addition, the chip related components 1020 may be combined with each other.

The network related components 1030 may include components implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+(HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network related components 1030 are not limited thereto, and may include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, and may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
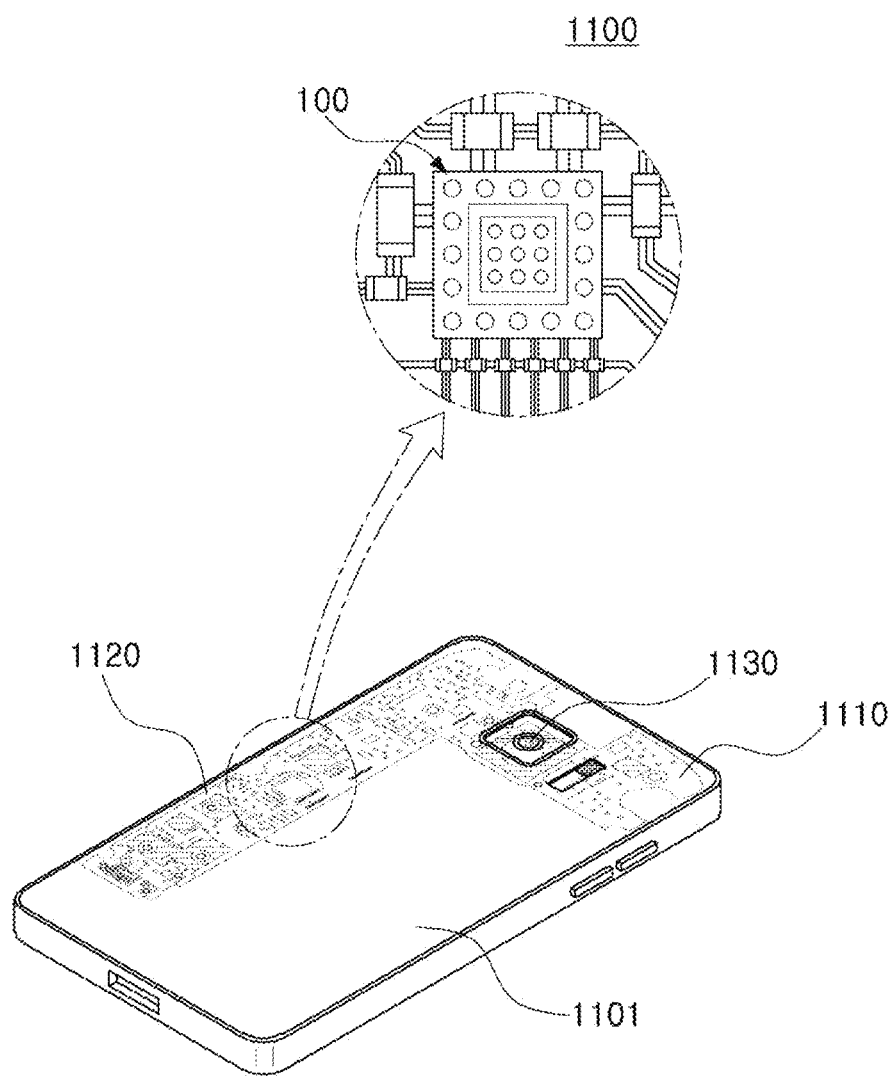
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Device (or Semiconductor Package)

Generally, numerous fine electrical circuits are integrated in a semiconductor chip. However, the semiconductor chip may not serve as a semiconductor finished product in itself, and may be damaged due to external physical or chemical impact. Therefore, the semiconductor chip may not be used by itself, but is instead packaged and used in an electronic device or the like in a package state.

The reason why semiconductor packaging is commonly used is that there is generally a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and use of packaging technology for buffering a difference in a circuit width between the semiconductor and the mainboard is thus advantageous.

Hereinafter, a semiconductor device manufactured by the packaging technology will be described in detail with reference to the accompanying drawings.

Figure 3:
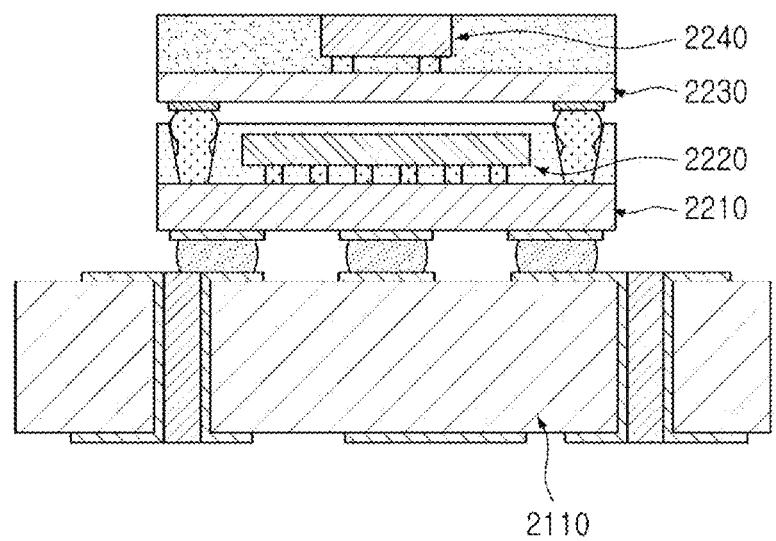
FIG. 3 is a schematic cross-sectional view illustrating a case where a 3D BGA package is mounted on a mainboard of an electronic device.

FIG. 3 is a schematic cross-sectional view illustrating a case where a 3D BGA package is mounted on a mainboard of an electronic device.

Each chip of an application specific integrated circuit (ASIC) such as a graphics processing unit (GPU), among semiconductor chips, is very high in price, and thus, it is very important to perform packaging with a high yield. For this purpose, a ball grid array (BGA) substrate 2210, or the like, on which thousands to hundreds of thousands of connection pads may be redistributed is first prepared before mounting a semiconductor chip, and a high-priced semiconductor chip such as a GPU 2220 is subsequently mounted and packaged on the BGA substrate 2210 through a surface mounting technology (SMT), and thereafter, a resultant structure is finally mounted on a mainboard 210.

Meanwhile, in the case of the GPU 2220, it is necessary to minimize a signal path to a memory such as a high-bandwidth memory (HBM) and, to this end, a semiconductor chip such as the HBM 2220 is mounted on an interposer package 2230 and subsequently packaged, which is stacked on the package in which the GPU 2220 is mounted, in a package-on-package (POP) form and used. In this case, however, a thickness of the device is excessively increased and there is a limitation in minimizing the signal path as well.

Figure 4:
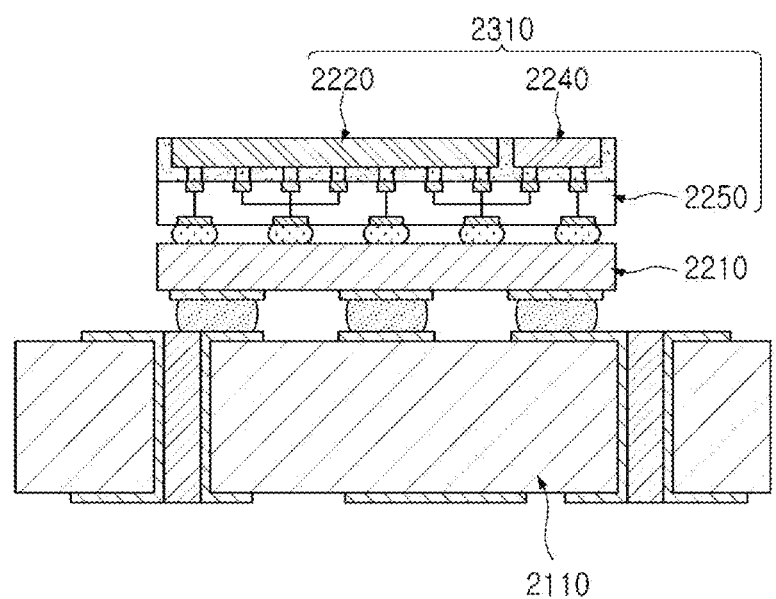
FIG. 4 is a schematic cross-sectional view illustrating a case where a 2.5D silicon interposer package is mounted on a mainboard.

FIG. 4 is a schematic cross-sectional view of a 2.5D silicon interposer package mounted on a mainboard.

In order to solve the above-mentioned problems, it may be considered to manufacture a semiconductor device 2310 by surface-mounting a first semiconductor chip such as the GPU 2220 and a second semiconductor chip such as the HBM 2240 side by side on a silicon interposer 2250 and packaging the same according to an 2.5 interposer technology. In this case, the GPU 2220 and the HBM 2240 having thousands to hundreds of thousands of connection pads may be redistributed and electrically connected by a minimal path. Also, when the semiconductor device 2310 is again mounted on the BGA substrate 2210, or the like, and redistributed, the semiconductor device 2310 may finally be mounted on the mainboard 2110. However, in the case of the silicon interposer 2250, it is very difficult to form a through silicon via (TSV) and high manufacturing cost incurs, and thus, the silicon interposer 2250 is not advantageous for a larger area and low cost.

Figure 5:
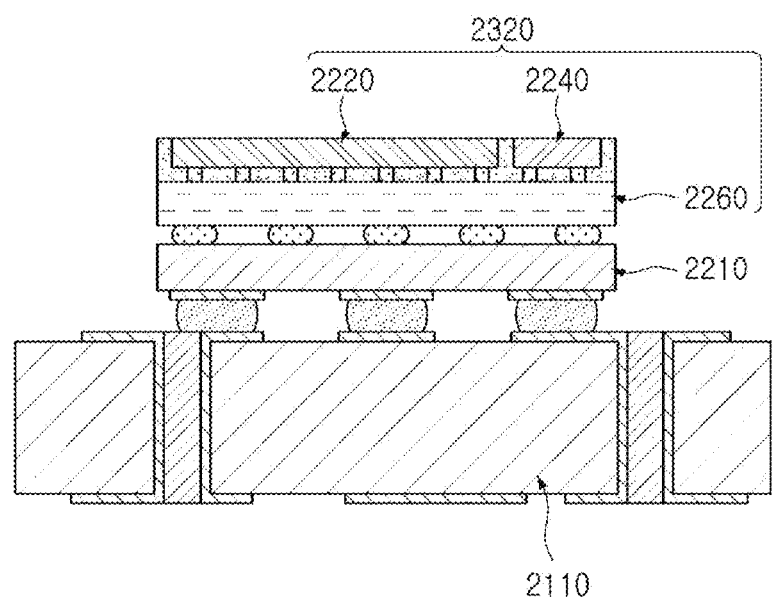
FIG. 5 is a schematic cross-sectional view illustrating a case where a 2.5D organic interposer package is mounted on a mainboard.

FIG. 5 is a schematic cross-sectional view illustrating a case where a 2.5D organic interposer package is mounted on a mainboard.

As an approach for solving the above-mentioned problems, it may be considered to use an organic interposer 2260 instead of the silicon interposer 2250. For example, it may be considered to manufacture the semiconductor device 2320 by surface-mounting the first semiconductor chip such as the GPU 2220 and the second semiconductor chip such as the HBM 2240 side by side on an organic interposer 2260 and packaging the same according to the 2.5 interposer technology. In this case, the GPU 2220 and the HBM 2240 having thousands to hundreds of thousands of connection pads may be redistributed and electrically connected by a minimal path. Also, when the semiconductor device 2310 is again mounted on the BGA substrate 2210, or the like, and redistributed, the semiconductor device 2310 may finally be mounted on the mainboard 2110. In addition, this method may be advantageous for a large area and low cost.

Meanwhile, the semiconductor device 2320 is manufactured by a package process of mounting chips 2220 and 2240 on the interposer 2260 and performing molding the same. This is because, without the molding, handling may not be performed so the semiconductor device 2320 cannot be connected to the BGA substrate 2210, or the like, and thus, rigidity is maintained through molding. However, when the molding is carried out, problems such as occurrence of warpage, a degradation of filling an underfill resin, occurrence of cracks between a die and a molding material, and the like, may arise due to a difference in coefficient of thermal expansion (CTE), or the like, between the interposer 2260 and the chips 2220 and 2240 and a molding material.

Hereinafter, various exemplary embodiments of the present disclosure will be described in detail with reference to the accompanying drawings.

Figure 6:
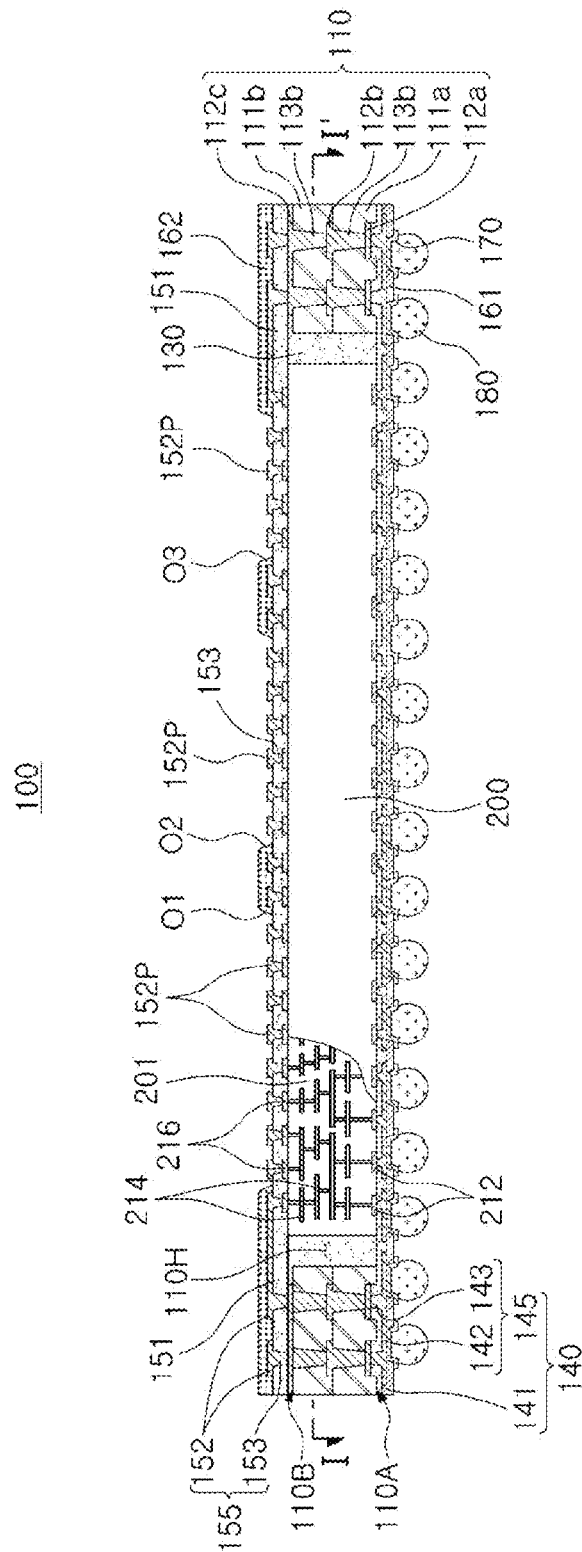
FIG. 6 is a schematic cross-sectional view illustrating a hybrid interposer according to an exemplary embodiment in the present disclosure.
Figure 7:
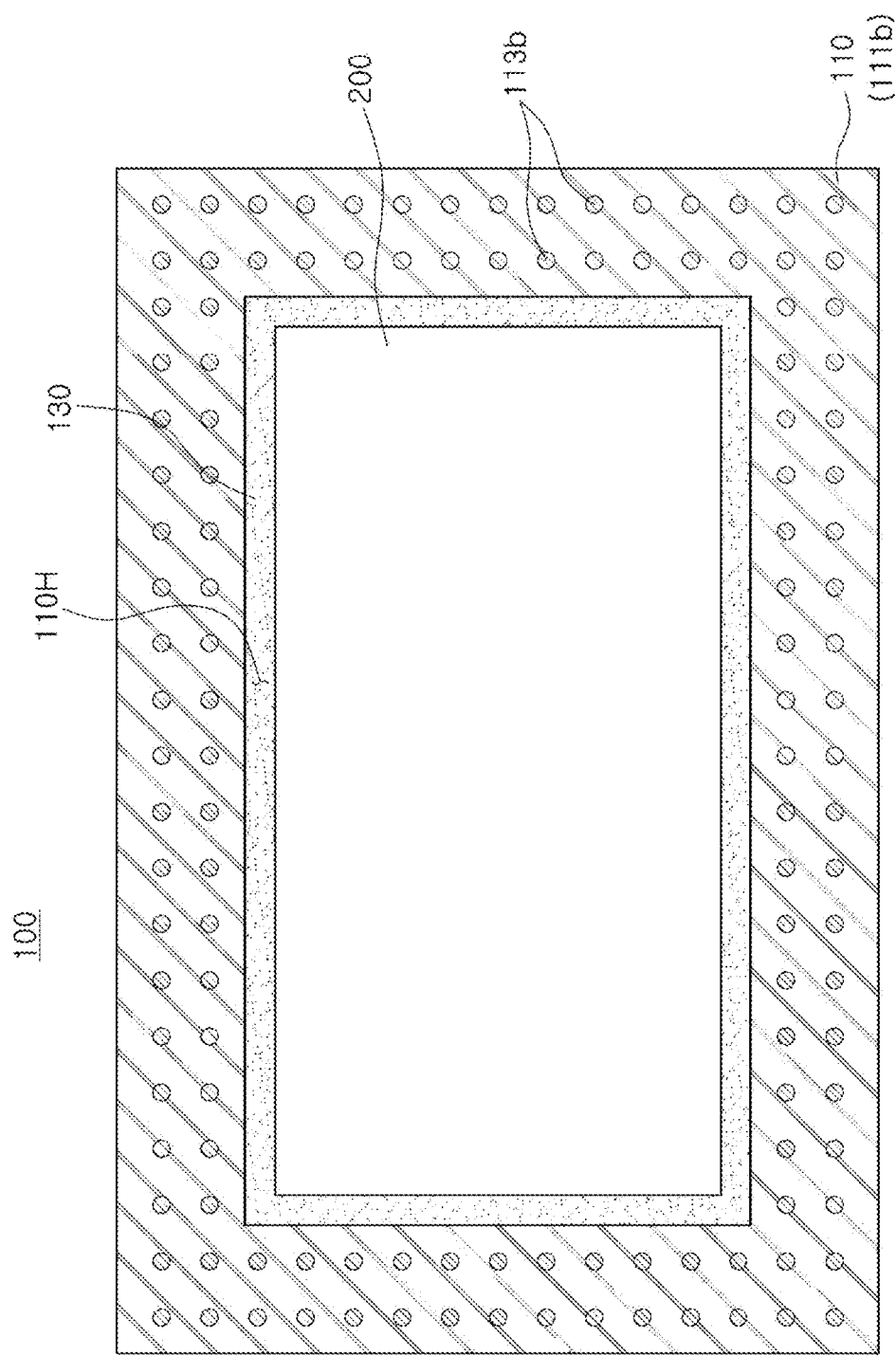
FIG. 7 is a plan view of a hybrid interposer illustrated in FIG. 6, taken along line I-I'.

FIG. 6 is a schematic cross-sectional view illustrating a hybrid interposer according to an exemplary embodiment in the present disclosure, and FIG. 7 is a plan view taken along line I-I' of a hybrid interposer illustrated in FIG. 6.

Referring to FIGS. 6 and 7, a hybrid interposer 100 according to the present exemplary embodiment includes an organic frame 110 having a first surface 100A and a second surface 100B positioned to oppose each other and having a cavity 110H, a connection structure 140 disposed on the first surface 110A of the organic frame 110 and having a first redistribution layer 145; an inorganic interposer 200 disposed on the connection structure 140 in the cavity 110H, and an encapsulant 130 encapsulating at least a portion of the inorganic interposer 200.

The organic frame 110 includes an insulating member having first and second insulating layers 111a and 111b. The organic frame 110 may serve to strengthen rigidity of the hybrid interposer 100 and secure uniformity of a thickness of the encapsulant 130. The insulating member of the organic frame 110 may include an organic insulating material such as a thermosetting resin such as an epoxy resin or a thermoplastic resin such as polyimide. In some exemplary embodiments, as the insulating member, a mixture obtained by mixing an organic insulating material as a main ingredient with an inorganic component may be used. For example, the insulating member may include a resin mixed with an inorganic filler, or a resin impregnated in glass fiber together with an inorganic filler. In a specific example, the insulating member may be an ABF (Ajinomoto Build-up Film) or a prepreg.

The inorganic interposer 200 has a first surface (i.e., lower surface) in contact with the connection structure 140, a second surface (i.e., upper surface) located to oppose the first surface, and an interconnection wiring 214 connecting the first surface and the second surface. The interconnection wiring 214 includes a pattern and a via and the inorganic interposer 200 may include a plurality of first and second pads 212 and 216 respectively positioned on the first and second surfaces and connected to the interconnection wiring 214. The interconnection wiring 214 of the inorganic interposer 200 may be connected to the first redistribution layer 145 by the first pad 212. The inorganic interposer 200 includes a substrate 201 formed of an inorganic material. For example, the substrate 201 may include a semiconductor substrate such as silicon or a glass substrate.

As described above, the hybrid interposer 100 has a structure in which the inorganic interposer 200 is embedded in the cavity 110H of the organic frame 110, thereby reducing an overall thickness.

Further, a complicated redistribution structure may be realized to be connected to each component such as an organic frame, an inorganic interposer, a connection structure, and the like.

The wiring structure of the organic frame 110 may include first to third wiring patterns 112a, 112b, and 112c and first and second wiring vias 113a and 113b connecting the first to third wiring patterns 112a, 112b, and 112c. A wiring structure of the organic frame 110, particularly, the first wiring pattern 112a, may be connected to a first redistribution layer 145 of the connection structure 140.

The connection structure 140 includes an insulating layer 141 and a first redistribution layer 145 disposed on the insulating layer 141. The first redistribution layer 145 includes a redistribution pattern 142 and a via 143 and may be connected to the interconnection wiring 214 of the inorganic interposer 200 together with the wiring structure. Specifically, as illustrated in FIG. 6, the redistribution pattern 142 may be connected to each of the first wiring pattern 112a of the wiring structure and the second pad 212 of the inorganic interposer 200 via the vias 143. The connection structure 140 employed in this exemplary embodiment is illustrated as including the first redistribution layer 145 of a single level but may be configured to include two or more redistribution layers in another exemplary embodiment.

The hybrid interposer 100 according to the present exemplary embodiment further includes an insulating layer 151 disposed on the second surface 110B of the organic frame 110 and the second surface of the inorganic interposer 200 and a second redistribution layer 155 disposed on the insulating layer 151.

The second redistribution layer 155 may provide a backside redistribution circuit connected to the wiring structure on the second surface 110B of the organic frame 110. The second redistribution layer 155 may include a redistribution pattern 152 disposed on the insulating layer 151 and a via 153 connected to the redistribution pattern 152 through the insulating layer 151. Also, the second redistribution layer 155 may be connected to the interconnection wiring 214 of the inorganic interposer 200. Specifically, the second redistribution layer 155 may be connected to the third wiring pattern 112c of the wiring structure and the second pad 216 of the inorganic interposer 200 via the vias 153.

In addition, a portion of the redistribution pattern 152 may be configured to be provided as a plurality of pads 152P for mounting semiconductor chips. A second passivation layer 162 may be disposed on the insulating layer 151 to cover the second redistribution layer 155. The second passivation layer 162 may provide first to third openings O1, O2, and O3 through which a plurality of pads 152P are exposed.

Figure 8:
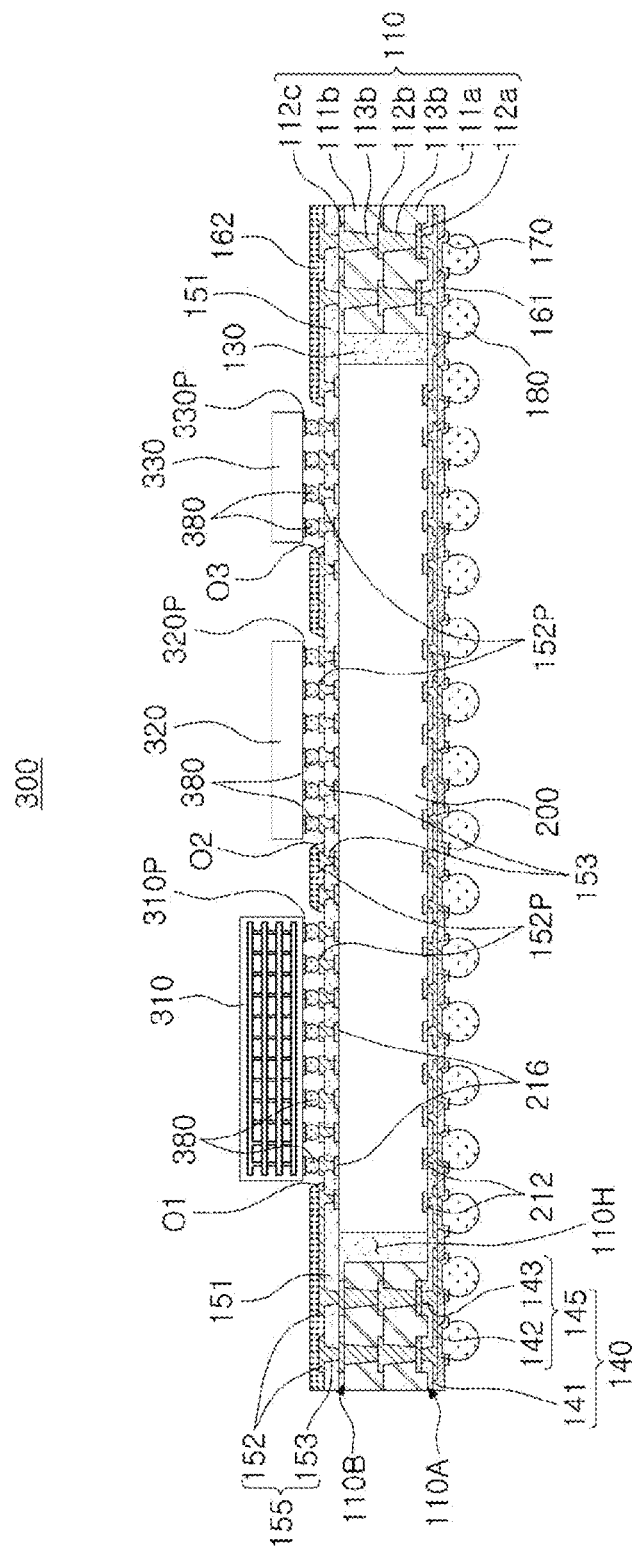
FIG. 8 is a schematic cross-sectional view illustrating a semiconductor package having a hybrid interposer illustrated in FIG. 6.

As illustrated in FIG. 8, first to third openings O1, O2, and O3 may be provided as mounting regions of first to third semiconductor chips 310, 320, and 330. FIG. 8 is a schematic cross-sectional view illustrating a semiconductor package having the hybrid interposer illustrated in FIG. 6.

The first to third semiconductor chips 310, 320, and 330 may be configured as various combinations selected from a memory chip, a logic chip, and an optical chip. For example, the memory chip may be a volatile memory chip such as a dynamic random access memory (DRAM) or a static random access memory (SRAM) or a non-volatile memory such as a phase change random access memory (PRAM), a magnetoresistive random access memory (MRAM), a ferroelectric random access memory (FeRAM) or resistive random access memory (RRAM). In addition, the logic chip may be, for example, a microprocessor, an analog device, or a digital signal processor. The optical chip may include a light emitting chip such as a light emitting diode (LED) or a CMOS image sensor (CIS) chip. For example, the first semiconductor chip 310 may be a memory chip such as HBM, the second semiconductor chip 320 may be a logic chip, and the third semiconductor chip 330 may be an optical chip.

Connection electrodes 310P, 320P, and 330P of the first to third semiconductor chips 310, 320, and 330 may be connected to a plurality of pads 152P by connecting members 380, respectively. The connecting member 380 may be a low melting point metal, for example, tin (Sn) or an alloy containing tin (Sn). Alternatively, an underfill resin (not shown) disposed between a surface (hereinafter referred to as an active surface) on which connection electrodes of the first to third semiconductor chips 310, 320, and 330 are formed and the insulating layer 151 may be provided. The underfill resin may stably fix the first to third semiconductor chips 310, 320, and 330 to the insulating layer 151. For example, the underfill resin may be a curable resin such as epoxy, or the like.

The plurality of pads 152P may be arranged at fine pitches so as to correspond to the arrangement of the connection electrodes 310P, 320P, and 330P of the first to third semiconductor chips 310, 320, and 330. For example, in the case of employing a semiconductor chip having a plurality of connection electrodes arranged at fine pitches, such as a high bandwidth memory (HBM), a pad arrangement having a narrower gap may be required.

In order to form the second redistribution layer 150 providing the pads 152P at fine pitches, the insulating layer 151 may include a photo imageable dielectric (PID) material. The second redistribution layer 155 may be formed to have a fine pattern using a photolithography process using the insulating layer 151 which is a PID material. The second redistribution layer 155 employed in the present exemplary embodiment may be connected to the second pad 216 of the inorganic interposer 200 through vias 153 arranged at fine pitches. As in the present exemplary embodiment, the insulating layer 151 may be disposed in contact with the second surface of the inorganic interposer 200. Only the insulating layer 151 formed of a PID material may be disposed on the second surface of the inorganic interposer 200. Therefore, holes for the redistribution vias 153 may be formed only by processing the insulating layer 151 using the photolithography process. For the arrangement of the insulating layer, the second surface of the inorganic interposer 200 may be located at a level substantially equal to or higher than the second surface of the organic frame 110.

An additional encapsulant (not shown) may further be disposed on the second passivation layer 162 to cover the first to third semiconductor chips 310, 320, and 330. Further, an upper surface of the encapsulant (not shown) may be polished so that upper surfaces of some of the semiconductor chips 310, 320, and 330 are exposed to facilitate heat dissipation. However, the present disclosure is not limited thereto and other reinforcing materials surrounding a heat sink or the semiconductor chips may be additionally introduced.

As illustrated in FIG. 6, a first passivation layer 161 may be disposed on a lower surface of the connection structure 140. The first passivation layer 161 has openings exposing at least portions of the first redistribution layer 142. Under bump metallurgy (UBM) layers 170 may be disposed in the openings, and the UBM layers 170 may be connected to electrical connection metals 180, respectively.

Hereinafter, each component included in the semiconductor package 100A according to the present exemplary embodiment will be described in more detail.

The frame 110 employed in the present exemplary embodiment includes a first insulating layer 111a in contact with the connection structure 140, a first wiring pattern 112a in contact with the connection structure 140 and embedded in the first insulating layer 111a, a second wiring pattern 112b disposed on the side of the first insulating layer 111a opposing the side where the first wiring pattern 112a is embedded, a second insulating layer 111b disposed on a surface of the side of the first insulating layer 111a opposing the side where the first wiring pattern 112a is embedded and covering at least a portion of the second wiring pattern 112b, and a third wiring pattern 112c disposed on a surface of the side of the second insulating layer 111b opposing the side where the second wiring pattern 112b is embedded. The first and second wiring patterns 112a and 112b and the second and third wiring patterns 112b and 112c are electrically connected through the first and second wiring vias 113a and 113b penetrating through the first and second insulating layers 111a and 111b, respectively. The first to third wiring layers 112a, 112b, and 112c are electrically connected to the redistribution layer 142 of the connection structure 140. The wiring structure of the frame employed in the present exemplary embodiment is illustrated as including tri-level wiring layers 112a, 112b, and 112c and wiring vias 113a and 113b connecting the three wiring layers 112a, 112b, and 112c, but the wiring structure may have any other number of layers and various other structures (see FIG. 10).

As illustrated in FIG. 6, the first wiring pattern 112a may be recessed into the first insulating layer 111a. In the case where the first wiring pattern 112a is recessed into the first insulating layer 111a so a lower surface of the first insulating layer 111a and a lower surface of the first wiring pattern 112a have a step, a problem that a material forming the encapsulant 130 bleeds to contaminate the first wiring pattern 112a may be prevented.

The first to third wiring patterns 112a, 112b, and 112c and the wiring vias 113a and 113b described above may include a conductive material such as copper (Cu), aluminum (Al), silver (Ag), tin (Sn), gold (Au), nickel (Ni), lead (Pb), titanium (Ti), or alloys thereof. The first to third wiring patterns 112a, 112b, and 112c may perform various functions according to a design thereof. For example, first to third wiring patterns 112a, 112b, and 112c may include a ground (GND) pattern, a power (PWR) pattern, a signal (S) pattern. Here, the signal S pattern includes various signals, for example, a data signal, or the like, except for the ground (GND) pattern, the power (PWR) pattern, and the like. It may also include via pads, wire pads, pads for electrical connection metals, and the like. The wiring layers 112a, 112b, and 112c may be formed through known plating, and may each include a seed layer and a conductive layer. The first to third wiring patterns 112a, 112b, and 112c may be thicker than the redistribution pattern 142 of the first redistribution layer.

The first and second wiring vias 113a and 113b may each be a field type via filled with a conductive material or may be a conformal type via in which a conductive material is formed along a wall surface of a via hole. Further, the first and second wiring vias 113a and 113b may each have a tapered shape. The first and second wiring vias 113a and 113b may be formed through plating and may each include a seed layer and a conductive layer.

When a hole for the first wiring via 113a is formed, some pads of the first wiring pattern 112a may serve as stoppers. Therefore, the first wiring via 113a may advantageously have a tapered shape in which a width of an upper end thereof is greater than that of a lower end thereof in terms of process. In this case, the first wiring via 113a may be integrated with a pad pattern of the second wiring pattern 112b. In addition, when a hole for the second wiring via 113b is formed, some pads of the second wiring pattern 112b may serve as stoppers. Thus, similarly to the first wiring via 113a, the second wiring via 113b may advantageously have a tapered shape in which a width of an upper end thereof is greater than that of a lower end thereof in terms of process. In this case, the second wiring via 113b may be integrated with the pad pattern of the third wiring pattern 112c. Although not shown, in some exemplary embodiments, a metal layer (not shown) may be disposed on a wall surface of the cavity 110H of the frame 110 for the purpose of shielding electromagnetic waves or for heat dissipation, and the metal layer (not shown) may surround the semiconductor chip 120.

The first to third semiconductor chips 310, 320, and 330 may be various types of semiconductor chips described above, and may be an integrated circuit (IC) in which hundreds to millions of devices are integrated in one chip. The semiconductor package according to the present exemplary embodiment is illustrated to have three semiconductor chips but may include at least one semiconductor chip.

The encapsulant 130 encapsulates the frame 110 and the first to third semiconductor chips 310, 320, and 330 and fills at least a portion of the cavity 110H. The encapsulant 130 is formed of an insulating material, and as the insulating material, a material including an inorganic filler and an insulating resin, for example, a thermosetting resin such as an epoxy resin, a thermoplastic resin such as polyimide, or a resin containing a reinforcing material such as an inorganic filler in the thermosetting resin or the thermoplastic resin, specifically ABF, FR-4, bismaleimide triazine (BT) resin, or the like, may be used. Further, a molding material such as an epoxy molding compound (EMC), or a photosensitive material, i.e., a photo imageable encapsulant (PIE), may also be used. In some exemplary embodiments, a material obtained by impregnating a core material such as an inorganic filler and/or glass fiber with an insulating resin such as a thermosetting resin or a thermoplastic resin may be used. The insulating layer 151 disposed on an upper surface of the encapsulant 130 may be formed of a material which is the same as or similar to that of the encapsulant 130, or may include the PID material advantageous for fine pitches as described above.

Similarly to the wiring structure, the second redistribution layer 155 may include a conductive material such as copper (Cu), aluminum (Al), silver (Ag), tin (Sn), gold (Au), nickel (Ni), lead (Pb), titanium (Ti), or alloys thereof. The second redistribution layer 155 may perform various functions according to a design. The second redistribution layer 155 may include via pads, wire pads, pads for electrical connection metals, and the like. The second redistribution layer 155 may be formed through known plating and may include a seed layer and a conductive layer. The redistribution via 153 may be a field type via filled with a conductive material or a conformal type via in which a conductive material is formed along a wall surface of a via hole. Further, the redistribution via 153 may have a tapered shape. A second redistribution vias 153 may also be formed through plating and may include a seed layer and a conductive layer.

The connection structure 140 may be configured to redistribute the first pad 212 of the inorganic interposer 200. The insulating layer 141 of the connection structure 140 may be formed of the above-described insulating material, and in the specific example, a photo imageable dielectric (PID) material may be used. In this case, since fine pitches may be introduced by photolithography, the first pad 212 of the inorganic interposer 200 may be redistributed very effectively.

Similarly to the second redistribution layer 155 and the wiring structure, the first redistribution layer 145 may be formed of a conductive material such as copper (Cu), aluminum (Al), silver (Ag), tin (Sn), gold (Au), nickel (Ni), lead (Pb), titanium (Ti), or alloys thereof. The first redistribution layer 145 may also perform various functions according to a design. For example, the first redistribution layer 145 may include a ground (GND) pattern, a power (PoWeR: PWR) pattern, a signal (S) pattern, Here, the signal S pattern includes various signals, for example, a data signal, or the like, except for the ground (GND) pattern, the power (PWR) pattern, and the like. It may also include via pads, wire pads, pads for electrical connection metals, and the like. The redistribution via 143 may be connected to the redistribution pattern 142 formed on a different layer so as to be integrally formed. The redistribution via 143 may also be fully filled with a conductive material or have a conductive material formed along a wall of the via. Also, a taper shape may be applied as a shape of the redistribution via 143.

The first and second passivation layers 161 and 162 may be provided as layers for protecting the hybrid substrate 100 against external physical or chemical damage. In detail, the first passivation layer 161 located on the bottom protects the connection structure 140 and the second passivation layer 162 located on the top may be provided to protect the second redistribution layer 155. For example, the first and second passivation layers 161 and 162 may be various insulating materials such as ABF, and in a specific example, the first and second passivation layers 161 and 162 may be a PID material.

The underbump metal (UBM) layer 170 may be used to improve connection reliability of the electrical connection metal 180. That is, the UBM layer 170 may improve board level reliability of the hybrid interposer 100 or the semiconductor package 300 according to the present exemplary embodiment. The UBM layer 170 may be provided as tens to tens of thousands UBM layers. The UBM layer 170 may be formed of a metal by a known metalization method, but is not limited thereto.

The electrical connection metal 180 is a component for physically and/or electrically connecting the hybrid interposer 100 or the semiconductor package 300 to the outside. For example, the hybrid interposer 100 or the semiconductor package 300 may be mounted on a mainboard of an electronic device through the electrical connection metal 180. The electrical connection metal 180 may be formed of a low melting point metal, for example, tin (Sn) or an alloy including tin (Sn). More specifically, the electrical connection metal 180 may be formed of solder, or the like but this is merely an example and the material is not particularly limited thereto. The electrical connection metal 180 may be a land, a ball, a pin, or the like. The electrical connection metal 180 may be formed as a multilayer or a single layer. When the electrical connection metal 180 is formed as a multilayer, the electrical connection metal 180 may include copper pillar and solder, and when the electrical connection metal 180 is formed of a single layer, the electrical connection metal 180 may include tin-silver solder or copper, but this is merely an example and the material is not particularly limited thereto. The number, spacing, arrangement type, etc., of the electrical connection metal 180 are not particularly limited and may be sufficiently modified according to design specifications of an ordinary person skilled in the art. For example, the number of electrical connection metal 180 may be tens to thousands, and may be greater or less.

Figure 9:
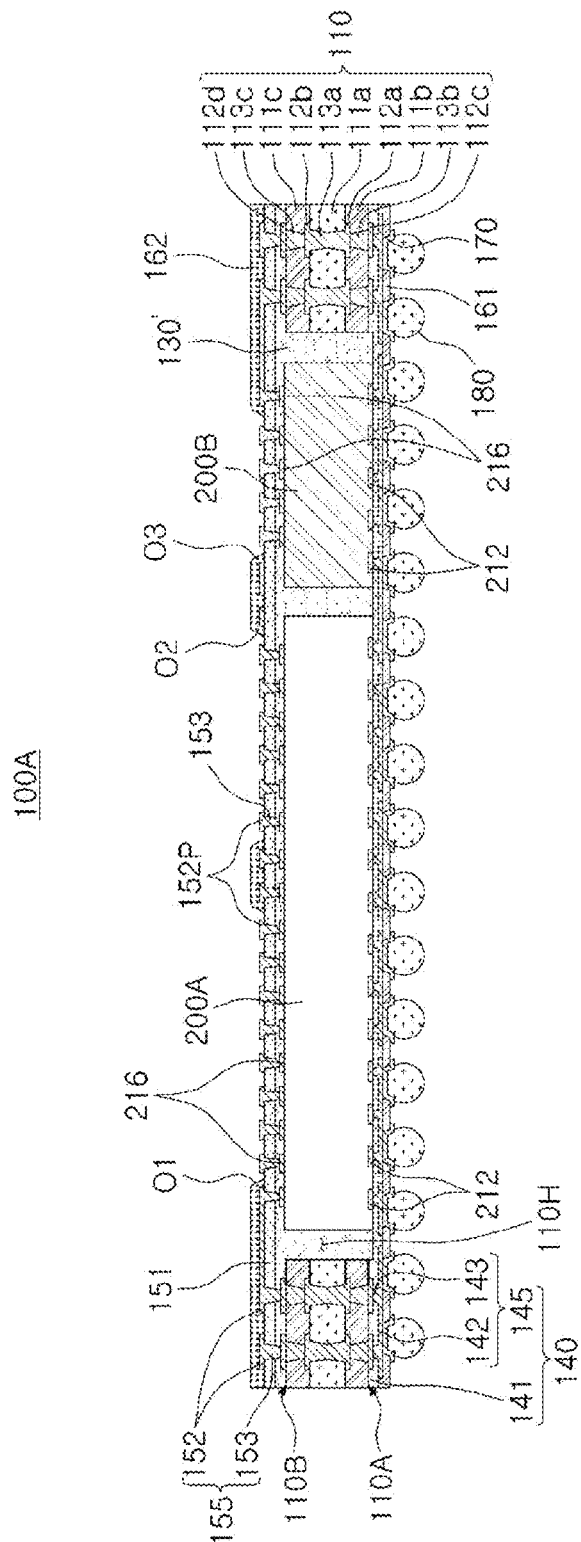
FIG. 9 is a schematic cross-sectional view illustrating a hybrid interposer according to an exemplary embodiment in the present disclosure.
Figure 10:
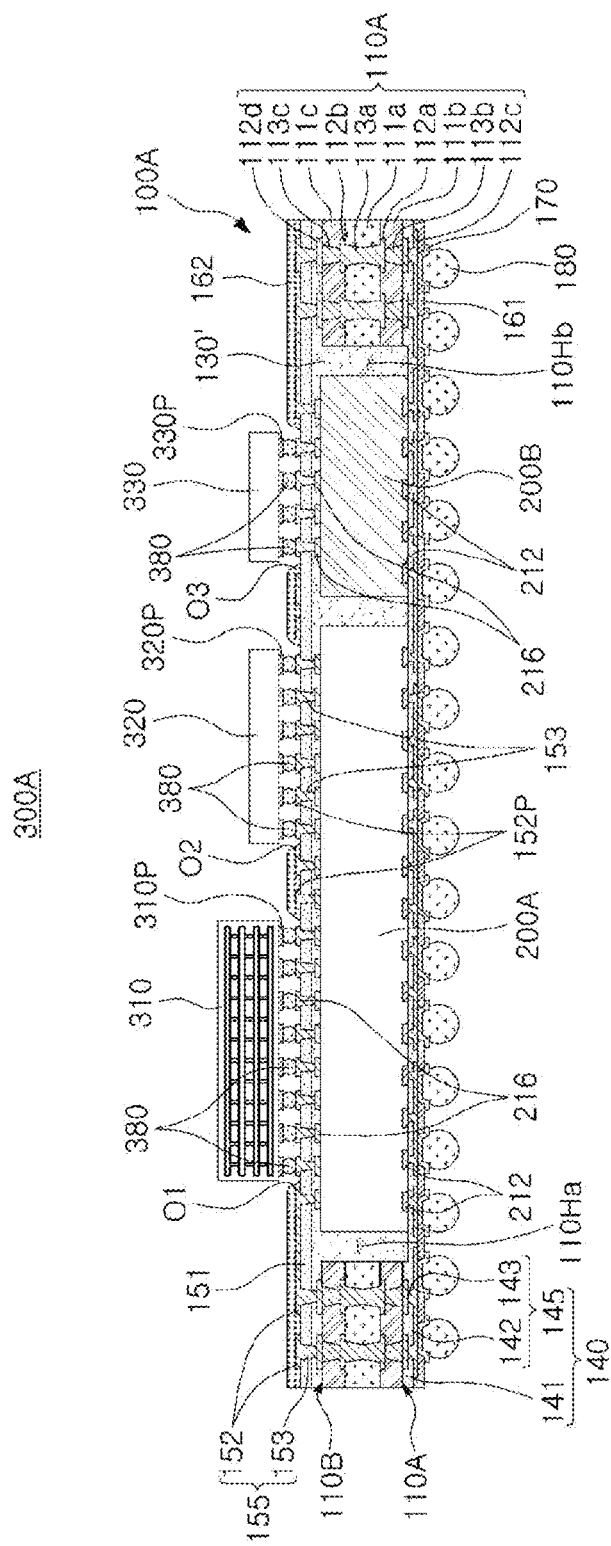
FIG. 10 is a schematic cross-sectional view illustrating a hybrid interposer illustrated in FIG. 9.

FIG. 9 is a schematic cross-sectional view illustrating a hybrid interposer according to an exemplary embodiment in the present disclosure, and FIG. 10 is a schematic cross-sectional view illustrating a hybrid interposer illustrated in FIG. 9.

Referring to FIG. 9, a hybrid interposer 100A according to the present exemplary embodiment may be understood to be similar to the structure illustrated in FIGS. 6 and 7, except that a plurality of inorganic interposers 200A and 200B are employed and a level of an encapsulant 130' and a wiring structure of an organic frame 110A are different. For components of the present exemplary embodiment, the descriptions of the components which are the same as or similar to those of the hybrid interposer 100 illustrated in FIGS. 6 and 7 may be referred to unless otherwise mentioned.

The hybrid interposer 100A according to the present exemplary embodiment includes first and second inorganic interposers 200A and 200B disposed in a single cavity 110H of the organic frame 110. The first and second inorganic interposers 200A and 200B have interconnection wirings (not shown) connecting upper and lower surfaces of the first and second inorganic interposers 200A and 200B. The interconnection wirings may be connected to the first redistribution layer 145 through a plurality of first pads 212 and connected to the second redistribution layer 155 through a plurality of second pads 216.

Different semiconductor chips may be disposed on the first and second inorganic interposers 200A and 200B, respectively. As an example, referring to the semiconductor package 300A illustrated in FIG. 10, a first semiconductor chip 310 and a second semiconductor chip 320 may be disposed on the first inorganic interposer 200A. Specifically, the first semiconductor chip 310 may be connected to the plurality of pads 152P exposed through a first opening O1 and the second semiconductor chip 320 may be connected to the plurality of pads 152P exposed through a second opening O2. A third semiconductor chip 330 may be disposed on the second inorganic interposer 200B. Specifically, the third semiconductor chip 330 may be connected to the plurality of pads 152P exposed through a third opening O3.

The first and second inorganic interposers 200A and 200B employed in the present exemplary embodiment may include substrates formed of different materials, respectively. The first and second inorganic interposers 200A and 200B may be configured to have different physical properties depending on a function of a semiconductor chip disposed thereon.

For example, the first and second semiconductor chips 310 and 320 may be semiconductor chips having fine pitch electrodes such as an HBM or a logic chip, and the first inorganic interposer 200A may include a semiconductor substrate such as silicon easy to form a fine pattern. The third semiconductor chip 330 may be a light emitting or light receiving device such as an optical chip or an image sensor such as a CIS chip, and the second inorganic interposer 200B may include a glass substrate having light transmittance.

In this exemplary embodiment, the encapsulant 130' is disposed to cover the second surface 110B of the organic frame 110 and the second surfaces of the first and second inorganic interposers 200A and 200B, and the insulating layer 151 may be disposed on the encapsulant 130'. The plurality of vias 153 may be formed to penetrate through the insulating layer 151 and the encapsulant 130'. The insulating layer 151 may include a material different from the encapsulant 130', but may also include the same material without being limited thereto. For example, the encapsulant 130' may include the same PID material as the insulating layer 151.

The organic frame 110A employed in this exemplary embodiment has a different structure, and thus, a wiring structure thereof may be modified accordingly. Specifically, the organic frame 110A includes a first insulating layer 111a, a first wiring pattern 112a disposed on one surface of the first insulating layer 111a, a second wiring pattern 112b disposed on the other surface of the first insulating layer 111a, a second insulating layer 111b disposed on one surface of the first insulating layer 111a and covering at least a portion of the first wiring pattern 112a, a third wiring pattern 112c disposed on a surface of the side of the second insulating layer 111b opposite to the side where the first wiring pattern 112a is embedded, a third insulating layer 111c disposed on the other surface of the first insulating layer 111a and covering at least a portion of the second wiring pattern 112b, a fourth wiring pattern 112d disposed on a surface of the side of the third insulating layer 111c opposite to the side where the second wiring pattern 112b is embedded, a first wiring via 113a penetrating through the first insulating layer 111a and electrically connecting the first and second wiring patterns 112a and 112b, a second wiring via 113b penetrating through the second insulating layer 111b and electrically connecting the first and third wiring patterns 112a and 112c, and a third wiring via 113c penetrating through the third insulating layer 111c and electrically connecting the second and fourth wiring patterns 112b and 112d. Since the frame 110 employed in this exemplary embodiment has a larger number of wiring patterns 112a, 112b, 112c and 112d, the first redistribution layer 145 of the connection structure 140 may be further simplified.

The first insulating layer 111a may be thicker than the second insulating layer 111b and the third insulating layer 111c. The first insulating layer 111a may be relatively thick to basically maintain rigidity and the second insulating layer 111b and the third insulating layer 111c may be introduced to form a larger number of wiring layers 112c and 112d. The first insulating layer 111a may include an insulating material different from the second insulating layer 111b and the third insulating layer 111c. For example, the first insulating layer 111a may be, for example, a prepreg including a core material such as glass fiber, an inorganic filler, and an insulating resin, and the second insulating layer 111b and the third insulating layer 111c may be ABF or PID including an inorganic filler and an insulating resin, but are not limited thereto. From a similar perspective, the first wiring vias 113a penetrating through the first insulating layer 111a may have a diameter greater than those of the second and third wiring vias 113b and 113c penetrating through the second and third insulating layers 111b and 111c, respectively. Further, the first wiring via 113a may have an hourglass or cylindrical shape, while the second and third wiring vias 113b and 113c may have tapered shapes in mutually opposite directions. The first to fourth wiring patterns 112a, 112b, 112c and 112d may be thicker than the redistribution pattern 142 of the first redistribution layer 145.

Although not shown in FIGS. 6 and 7, a second inorganic interposer 200B may be disposed in the cavity 110H and below the third semiconductor chip 330, in a manner similar to that shown in FIGS. 9 and 10. In this case, the inorganic interposer 200 may be configured in a manner similar to the inorganic interposer 200A shown in FIGS. 9 and 10.

Figure 11:
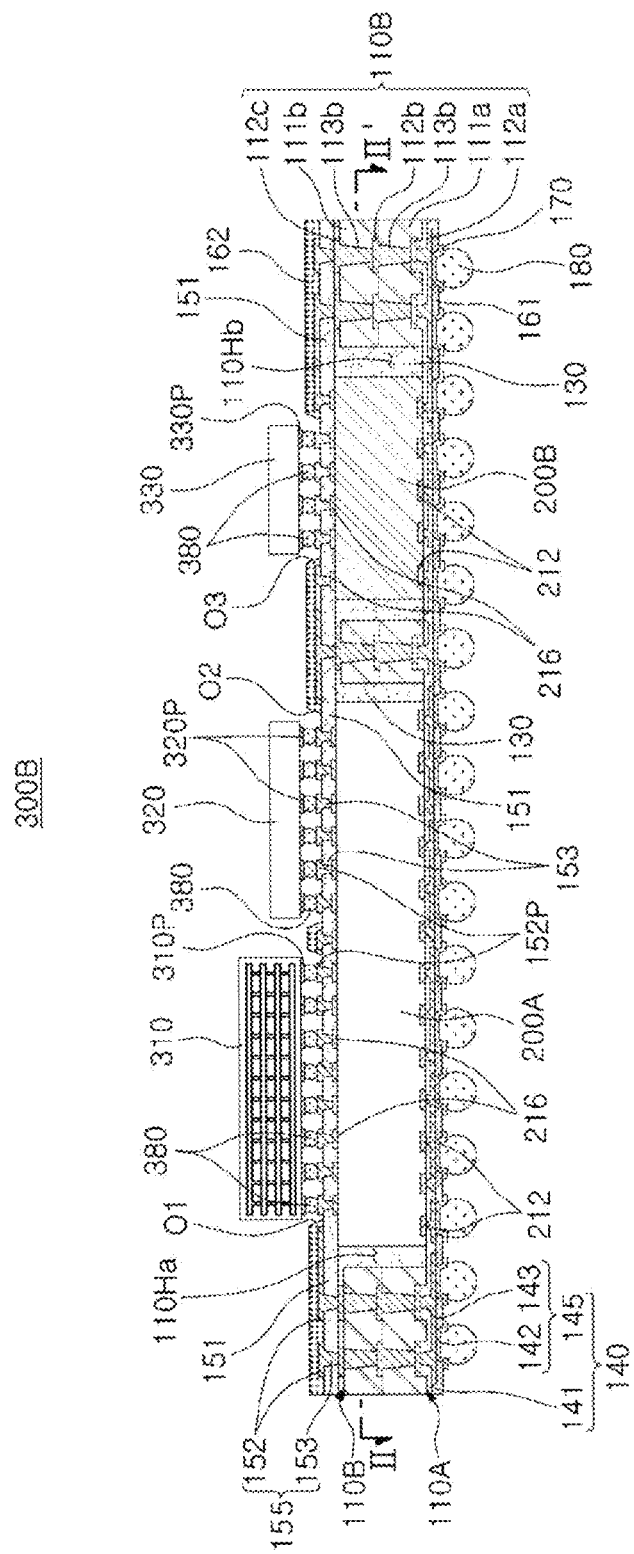
FIG. 11 is a schematic cross-sectional view illustrating a semiconductor package according to an exemplary embodiment in the present disclosure.
Figure 12:
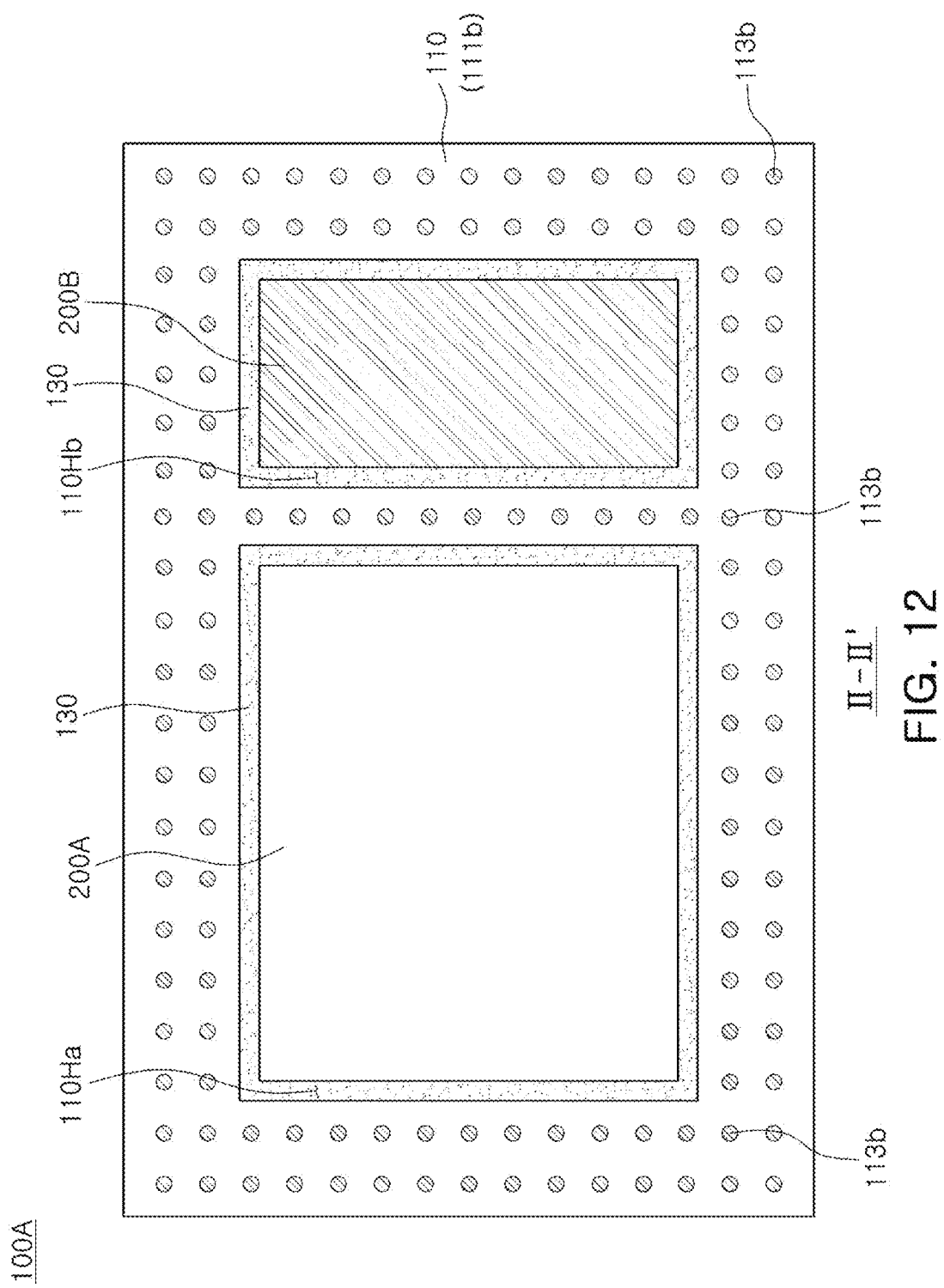
FIG. 12 is a plan view of the semiconductor package illustrated in FIG. 11 taken along line II-II'.

FIG. 11 is a schematic cross-sectional view illustrating a semiconductor package according to an exemplary embodiment in the present disclosure, and FIG. 12 is a plan view taken along line II-II' of the semiconductor package of FIG. 11.

Referring to FIGS. 11 and 12, the semiconductor package 300B according to the present exemplary embodiment may be understood to be similar to the structure illustrated in FIG. 8, except that the organic frame 110B has a plurality of cavities 110Ha and 110Hb and that a plurality of inorganic interposers 200A and 200B are employed. For components of the present exemplary embodiment, the descriptions of the components which are the same as or similar to those of the hybrid interposer 100 and the semiconductor package illustrated in FIGS. 6 through 8 may be referred to unless otherwise mentioned.

The organic frame 110B employed in the present exemplary embodiment may include first and second cavities 110Ha and 110Hb. As illustrated in FIG. 12, the first and second cavities 110Ha and 110Hb are separated by the insulating members 111a and 111b, and a wiring structure may be formed even at an insulating member disposed between the first and second cavities 110Ha and 110Hb.

The first and second inorganic interposers 200A and 200B may be disposed in the first and second cavities 110Ha and 110Hb, respectively. The first and second inorganic interposers 200A and 200B may be connected to the wiring structure of the frame 110 located between the first and second cavities 110Ha and 110Hb by the second redistribution layer 155, and thus, interconnection wirings (not shown) of the first and second inorganic interposers 200A and 200B and connections of wiring structures may vary.

Similarly to the semiconductor package 300A illustrated in FIG. 10, the first and second inorganic interposers 200A and 200B may include substrates formed of different materials, respectively. The first and second inorganic interposers 200A and 200B may be configured to have different physical properties depending on a function of a semiconductor chip disposed thereon. For example, the first and second semiconductor chips 310 and 320 may be semiconductor chips having fine pitch electrodes such as an HBM or a logic chip, and the first inorganic interposer 200A may include a semiconductor substrate such as silicon easy to form a fine pattern. The third semiconductor chip 330 may be a light emitting or light receiving device such as an optical chip or an image sensor such as a CIS chip, and the second inorganic interposer 200B may include a glass substrate having light transmittance.

Figure 13:
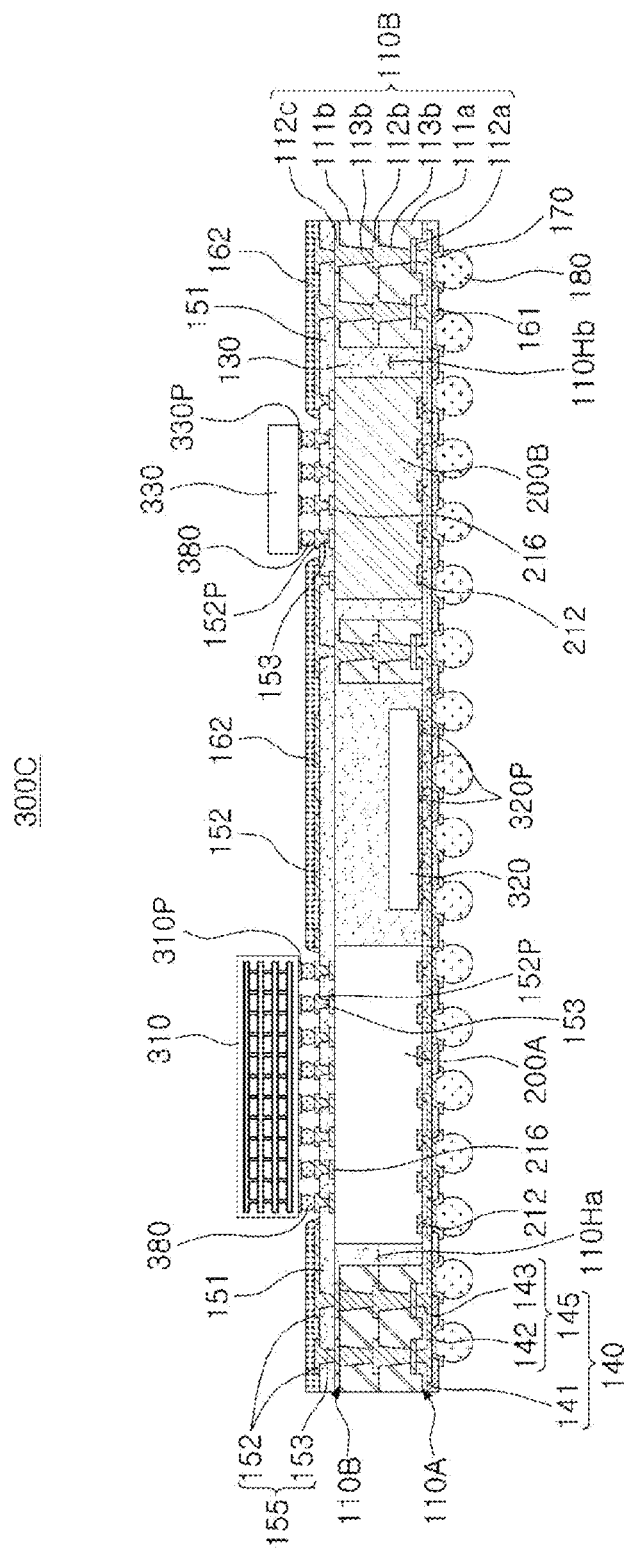
FIG. 13 is a schematic cross-sectional view illustrating a semiconductor package according to an exemplary embodiment in the present disclosure.

FIG. 13 is a schematic cross-sectional view illustrating a semiconductor package according to an exemplary embodiment in the present disclosure.

Referring to FIG. 13, the semiconductor package 300B according to the present exemplary embodiment may be understood to be similar to the structure illustrated in FIG. 11, except that a semiconductor chip is directly mounted in at least one cavity 110Ha among the plurality of cavities. For components of the present exemplary embodiment, the descriptions of the components which are the same as or similar to those of the hybrid interposers 100 and 100A and the semiconductor packages 300 and 300B illustrated in FIGS. 6 to 8 and FIGS. 11 and 12 may be referred to unless otherwise mentioned.

The organic frame 100B employed in the present exemplary embodiment may include the first and second cavities 110Ha and 110Hb similarly to the organic frame 110B illustrated in FIGS. 11 and 12, and the first second inorganic interposers 200A and 200B may be disposed in the first and second cavities 110Ha and 110Hb, respectively. However, unlike the previous exemplary embodiment, the first inorganic interposer 200A may have a relatively small size, only the first semiconductor chip 310 is mounted on the first inorganic interposer 200A, and the second semiconductor chip 320 may be disposed in a remaining space of the first cavity 110Ha. The second semiconductor chip 320 may be encapsulated by an encapsulant in the first cavity 110Ha. The second semiconductor chip 320 may be disposed on the connection structure 140 in the first cavity 110Ha and a connection electrode 320P of the second semiconductor chip 320 may be electrically connected to the first redistribution layer 145.

Specifically, the second semiconductor chip 320 is embedded with the first inorganic interposer 200A in the first cavity 110Ha of the organic frame 110B, and after the second inorganic interposer 200B is embedded in the second cavity 110Hb, encapsulating is performed by the encapsulant 130, and a process of forming the connection structure 140, i.e., a process of forming the first redistribution layer 145 may be applied. During this process, the first redistribution layer 145 may be formed to be electrically connected to the first pad 212 of the first and second inorganic interposers 200A and 200B, the connection electrode 320P of the second semiconductor chip 320, and the first wiring pattern 112a of the wiring structure.

As set forth above, according to exemplary embodiments of the present disclosure, the redistribution layer capable of implementing fine pitches on the inorganic interposer and the organic frame may be provided. The thickness may be reduced by embedding the inorganic interposer in the cavity of the organic frame, and a degree of freedom of device arrangement may increase by additionally embedding a specific semiconductor chip or a passive component in the cavity if necessary. A plurality of inorganic interposers having various characteristics may be combined to be used.

While exemplary embodiments have been illustrated and described above, it will be apparent to those skilled in the art that modifications and variations could be made without departing from the scope of the present disclosure as defined by the appended claims.

What is claimed is:

1. A semiconductor package comprising:
   an organic frame having first and second surfaces opposing each other, having a cavity, and having a wiring structure connecting the first and second surfaces;
   a connection structure disposed on the first surface of the organic frame and having a first redistribution layer connected to the wiring structure;
   at least one inorganic interposer disposed in the cavity, having a first surface in contact with the connection structure and a second surface opposite to the first surface, and having an interconnection wiring connected to the first redistribution layer and connecting the first surface and the second surface of the at least one inorganic interposer to each other;
   an encapsulant encapsulating at least a portion of the at least one inorganic interposer disposed in the cavity;
   an insulating layer disposed on the second surface of the organic frame and the second surface of the at least one inorganic interposer;
   a second redistribution layer disposed on the insulating layer, connected to each of the wiring structure and the interconnection wiring, and having portions provided as a plurality of pads; and
   at least one semiconductor chip having connection electrodes respectively connected to the plurality of pads.

2. The semiconductor package of claim 1, wherein the second redistribution layer includes a redistribution layer disposed on the insulating layer and having the plurality of pads, and a plurality of vias penetrating through the insulating layer and connected to each of the wiring structure and the interconnection wiring.

3. The semiconductor package of claim 2, wherein the insulating layer includes a photo imageable dielectric (PID) material.

4. The semiconductor package of claim 3, wherein the insulating layer is in contact with the second surface of the at least one inorganic interposer.

5. The semiconductor package of claim 4, wherein the second surface of the at least one inorganic interposer is substantially at the same level or higher than the second surface of the organic frame.

6. The semiconductor package of claim 2, wherein the encapsulant covers the second surface of the organic frame and the second surface of the inorganic interposer,
   the insulating layer is disposed on the encapsulant, and
   the plurality of vias penetrate through the insulating layer and the encapsulant.

7. The semiconductor package of claim 1, wherein the at least one inorganic interposer includes a glass substrate or a semiconductor substrate.

8. The semiconductor package of claim 1, wherein the at least one semiconductor chip includes a plurality of semiconductor chips.

9. The semiconductor package of claim 8, wherein the at least one inorganic interposer includes a plurality of inorganic interposers, and at least one of the plurality of semiconductor chips is disposed on each of the plurality of inorganic interposers.

10. The semiconductor package of claim 9, wherein the plurality of inorganic interposers is formed of different materials.

11. The semiconductor package of claim 9, wherein the cavity of the organic frame includes a plurality of cavities, and
    the plurality of inorganic interposers are disposed in the plurality of cavities, respectively.

12. The semiconductor package of claim 11, further comprising an additional semiconductor chip disposed in at least one of the plurality of cavities and having a connection electrode disposed on the connection structure and connected to the first redistribution layer.

13. The semiconductor package of claim 1, further comprising a passivation layer disposed on the insulating layer and having at least one opening exposing the plurality of pads.

14. The semiconductor package of claim 1, wherein the organic frame includes first and second insulating layers sequentially disposed on the connection structure,
    the wiring structure includes a first wiring pattern embedded in the first insulating layer and disposed to be in contact with the connection structure, a second wiring pattern disposed on a side of the first insulating layer opposite to the side where the first wiring pattern is embedded, a third wiring pattern disposed on a side of the second insulating layer opposite to the side where the second wiring pattern is located, a first wiring via penetrating through the first insulating layer and connecting the first and second wiring patterns, and a second wiring via penetrating through the second insulating layer and connecting the second and third wiring patterns.

15. The semiconductor package of claim 14, wherein the first and second insulating layers are made of an organic insulating material.

16. The semiconductor package of claim 1, wherein the organic frame includes a first insulating layer and second and third insulating layers respectively disposed on opposing surfaces of the first insulating layer, and
    the wiring structure includes first and second wiring patterns respectively disposed on the opposing surfaces of the first insulating layer, a third wiring pattern disposed on the second insulating layer, a fourth wiring pattern disposed on the third insulating layer, a first wiring via penetrating through the first insulating layer and connecting the first and second wiring patterns, a second wiring via penetrating through the second insulating layer and connecting the second and third wiring patterns, and a third wiring via penetrating through the third insulating layer and connecting the third and fourth wiring patterns.

17. The semiconductor package of claim 16, wherein the first and second insulating layers are made of an organic insulating material.

18. A hybrid interposer comprising:

an organic frame having first and second surfaces opposing each other, having a cavity, and having a wiring structure connecting the first and second surfaces;

a connection structure disposed on the first surface of the organic frame and having a first redistribution layer connected to the wiring structure;

at least one inorganic interposer disposed in the cavity, having a first surface in contact with the connection structure and a second surface opposite to the first surface, and having an interconnection wiring connected to the first redistribution layer and connecting the first surface and the second surface of the at least one inorganic interposer to each other;

an encapsulant encapsulating at least a portion of the at least one inorganic interposer disposed in the cavity;

an insulating layer disposed on the second surface of the organic frame and the second surface of the at least one inorganic interposer; and a second redistribution layer disposed on the insulating layer, connected to each of the wiring structure and the interconnection wiring, and having portions provided as a plurality of pads.

19. The hybrid interposer of claim 18, wherein the insulating layer includes a photo imageable dielectric (PID) material.

20. The hybrid interposer of claim 18, wherein the at least one inorganic interposer includes a plurality of inorganic interposers made of different materials.

\* \* \* \* \*